(12) United States Patent
Chen et al.

(10) Patent No.: US 11,494,018 B2
(45) Date of Patent: Nov. 8, 2022

(54) TOUCH DISPLAY SUBSTRATE, MANUFACTURING METHOD THEREOF, AND TOUCH DISPLAY APPARATUS

(71) Applicants: MIANYANG BOE OPTOELECTRONICS TECHNOLOGY CO., Ltd., Sichuan (CN); BOE Technology Group Co., Ltd., Beijing (CN)

(72) Inventors: Yunte Chen, Beijing (CN); Jin Seok Lee, Beijing (CN); Chongxi Wei, Beijing (CN)

(73) Assignees: MIANYANG BOE OPTOELECTRONICS TECHNOLOGY CO., LTD., Sichuan (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/255,437

(22) PCT Filed: Jun. 2, 2020

(86) PCT No.: PCT/CN2020/093914
§ 371 (c)(1),
(2) Date: Dec. 23, 2020

(87) PCT Pub. No.: WO2020/244502
PCT Pub. Date: Dec. 10, 2020

(65) Prior Publication Data
US 2021/0263607 A1    Aug. 26, 2021

(30) Foreign Application Priority Data
Jun. 5, 2019    (CN) .......................... 201910484793.1

(51) Int. Cl.
*G06F 3/041* (2006.01)
*G06F 3/044* (2006.01)

(52) U.S. Cl.
CPC .......... *G06F 3/0412* (2013.01); *G06F 3/0416* (2013.01); *G06F 3/0443* (2019.05);
(Continued)

(58) Field of Classification Search
None
See application file for complete search history.

(56) References Cited

U.S. PATENT DOCUMENTS

2012/0075218 A1   3/2012  Lin et al.
2016/0043336 A1*  2/2016  Kim ...................... H01L 27/323
                                                                257/40
(Continued)

FOREIGN PATENT DOCUMENTS

CN    106020553 A    10/2016
CN    106708323 A    5/2017
(Continued)

OTHER PUBLICATIONS

International Search Report for PCT/CN2020/093914 dated Sep. 3, 2020.
(Continued)

*Primary Examiner* — Stephen T. Reed
(74) *Attorney, Agent, or Firm* — Ling Wu; Stephen Yang; Ling and Yang Intellectual Property

(57) ABSTRACT

A touch display substrate and a manufacturing method thereof, and a touch display apparatus are provided, the touch display substrate includes a base substrate, and a touch structure layer and a display structure layer disposed on the base substrate; wherein the touch structure layer is provided to implement touch control, the display structure layer is provided to implement display, the touch structure layer is
(Continued)

located on a side, close to the base substrate, of the display structure layer.

18 Claims, 6 Drawing Sheets

(52) U.S. Cl.
CPC .. *G06F 3/0446* (2019.05); *G06F 2203/04103* (2013.01); *G06F 2203/04107* (2013.01); *G06F 2203/04111* (2013.01); *G06F 2203/04112* (2013.01)

(56) References Cited

U.S. PATENT DOCUMENTS

| | | | |
|---|---|---|---|
| 2018/0321783 A1 | 11/2018 | Guo et al. | |
| 2019/0324569 A1 | 10/2019 | Ma et al. | |
| 2020/0110510 A1* | 4/2020 | Hoch | G06F 3/0443 |
| 2020/0272265 A1 | 8/2020 | Liu et al. | |

FOREIGN PATENT DOCUMENTS

| | | |
|---|---|---|
| CN | 107491211 A | 12/2017 |
| CN | 108563361 A | 9/2018 |
| CN | 109407893 A | 3/2019 |
| CN | 109669572 A | 4/2019 |
| CN | 110187798 A | 8/2019 |

OTHER PUBLICATIONS

Office Action dated Mar. 15, 2021 for Chinese Patent Application No. 201910484793.1 and English Translation.

* cited by examiner

TOUCH DISPLAY SUBSTRATE, MANUFACTURING METHOD THEREOF, AND TOUCH DISPLAY APPARATUS

CROSS-REFERENCE TO RELATED APPLICATIONS

The present application is a U.S. National Phase Entry of International Application No. PCT/CN2020/093914 having an international filing date of Jun. 2, 2020, which claims the priority of Chinese patent application No. 201910484793.1, filed to the CNIPA on Jun. 5, 2019 and entitled "A Touch Display Substrate and Manufacturing Method Thereof, and A Touch Display Apparatus". The above-identified applications are incorporated into this disclosure by reference in their entireties.

TECHNICAL FIELD

The present disclosure relates to, but is not limited to, the field of touch display technology, in particular to a touch display substrate and a manufacturing method thereof, a touch display apparatus.

BACKGROUND

Touch technology is a technology of achieving control operation through touch. With the rapid development of display technology, the touch technology has been applied to various electronic devices, and is increasingly sought-after by users.

Touch of display products is usually implemented with an on cell touch substrate. The on cell touch substrate is to cover the surface of the display product with the touch screen, which not only may damage the display product and reduce the yield of the display product during a production process, but also makes the display product thicker.

SUMMARY

The following is a summary of the subject matter described in detail in the present disclosure. This summary is not intended to limit the protection scope of the claims.

In a first aspect, the present disclosure provides a touch display substrate including a base substrate, and a touch structure layer and a display structure layer disposed on the base substrate.

The touch structure layer is configured to implement touch control, and the display structure layer is configured to implement display, and the touch structure layer is located on a side, close to the base substrate, of the display structure layer.

In some possible implementations, the touch structure layer includes a first touch electrode, a second touch electrode and an insulating layer; the first touch electrode is disposed on the same layer as the second touch electrode.

The insulating layer is located on a side, close to the base substrate, of the first touch electrode, and is provided to insulate the first touch electrode from the second touch electrode.

In some possible implementations, both the first touch electrode and the second touch electrode are formed by a metal mesh structure.

A line width of the metal mesh is 2 microns to 5 microns.

In some possible implementations, the touch structure layer further includes a connecting layer.

The first touch electrode includes a plurality of mutually independent sub-touch electrodes; adjacent sub-touch electrodes are electrically connected by the connecting layer.

In some possible implementations, the connecting layer is formed by a metal mesh structure.

In some possible implementations, the base substrate is a transparent substrate.

A manufacturing material of the base substrate includes polyimide.

In some possible implementations, the display structure layer includes a driving structure layer, a light-emitting structure layer, and an encapsulation layer.

The driving structure layer is located on a side, close to the base substrate, of the light-emitting structure layer, and the encapsulation layer is located on a side, away from the base substrate, of the light-emitting structure layer.

An orthographic projection of the touch structure layer on the base substrate and an orthographic projection of the light-emitting structure layer on the base substrate have an overlapping area.

In some possible implementations, the driving structure layer includes a transistor, a storage capacitor, and a shielding layer, and the storage capacitor includes a first plate and a second plate.

The shielding layer is disposed on the same layer as an active layer of the transistor, the first polar plate is disposed on the same layer as a gate electrode of the transistor, and the second polar plate is located on a side, away from the base substrate, of the first polar plate, and disposed in a different layer from source-drain electrodes of the transistor.

An orthographic projection of the shielding layer on the base substrate is at least partially overlapped with that of the first polar plate on the base substrate, and an orthographic projection of the second polar plate on the base substrate is at least partially overlapped with that of the first polar plate on the base substrate.

In some possible implementations, the driving structure layer includes a first insulating layer, a semiconductor layer, a second insulating layer, a first metal layer, a third insulating layer, a second metal layer, a fourth insulating layer, a third metal layer, and a flat layer which are sequentially disposed along a direction perpendicular to the base substrate.

The semiconductor layer includes the active layer of the transistor and the shielding layer, the first metal layer includes the gate electrode of the transistor and the first plate, the second metal layer includes the second plate, and the third metal layer includes the source-drain electrodes of the transistor.

In some possible implementations, the light-emitting structure layer includes a first electrode, an organic light-emitting layer, a second electrode, and a pixel define layer.

The first electrode is disposed on a side, close to the base substrate, of the organic light-emitting layer, and the second electrode is disposed on a side, away from the base substrate, of the organic light-emitting layer.

The first electrode is connected with the drain electrode of the transistor.

In some possible implementations, the touch display substrate further includes an isolation column disposed between the light-emitting structure layer and the encapsulation layer.

An orthographic projection of the pixel define layer on the base substrate covers an orthographic projection of the isolation column on the base substrate.

In some possible implementations, the touch display substrate further includes a barrier layer.

The barrier layer is located on a side, close to the base substrate, of the touch structure layer.

In some possible implementations, the touch display substrate further includes a protection layer.

The protection layer is located on a side, close to the display structure layer, of the touch structure layer.

In some possible implementations, the display structure layer includes an organic light-emitting diode element layer and an encapsulation layer provided to encapsulate the organic light-emitting diode element layer.

An orthographic projection of the touch structure layer on the base substrate and an orthographic projection of the organic light-emitting diode element layer on the base substrate have an overlapping area.

In a second aspect, the disclosure also provides a touch display apparatus, which includes the aforementioned touch display substrate.

In a third aspect, the present disclosure also provides a method for manufacturing a touch display substrate, for manufacturing the aforementioned touch display substrate, and the method includes: providing a rigid substrate; forming a base substrate on the rigid substrate; forming a touch structure layer on the base substrate; forming a display structure layer on the touch structure layer; and stripping the rigid substrate.

In some possible implementations, forming the touch structure layer on the base substrate includes: forming a connecting layer on the base substrate through a patterning process; forming an insulating layer on a side, away from the base substrate, of the connecting layer, through a patterning process; and forming a first touch electrode and a second touch electrode on a side, away from the base substrate, of the insulating layer, through a patterning process.

In some possible implementations, before forming the touch structure layer on the base substrate, the method further includes: forming a barrier layer on the base substrate through a patterning process.

After forming the touch structure layer on the base substrate, the method further includes: forming a protection layer on a side, away from the base substrate, of the touch structure layer, through a patterning process.

In some possible implementations, forming a display structure layer on the touch structure layer includes: forming a driving structure layer on the touch structure layer; forming a light-emitting structure layer on the driving structure layer; and forming an encapsulation layer on the light-emitting structure layer.

In some possible implementations, forming the driving structure layer on the touch structure layer includes: forming a first insulating layer, a semiconductor layer, a second insulating layer, a first metal layer, a third insulating layer, a second metal layer, a fourth insulating layer, a third metal layer and a flat layer sequentially on the touch structure layer to form the driving structure layer; forming the light-emitting structure layer on the driving structure layer; forming a first electrode, a pixel define layer, an organic light-emitting layer and a second electrode sequentially on the driving structure layer to form the light-emitting structure layer.

Forming the encapsulation layer on the light-emitting structure layer includes: forming the isolation column and the encapsulation layer sequentially on the light-emitting structure layer.

Other aspects will become apparent upon reading and understanding accompanying drawings and the detailed description.

BRIEF DESCRIPTION OF DRAWINGS

Accompanying drawings are used for providing an understanding of technical solutions of the present disclosure and forming a part of the specification. Together with embodiments of the present disclosure, the drawings are used for explaining technical solutions of the present disclosure but not constituting a limitation on the technical solutions of the present disclosure.

DETAILED DESCRIPTION

Figure 1:
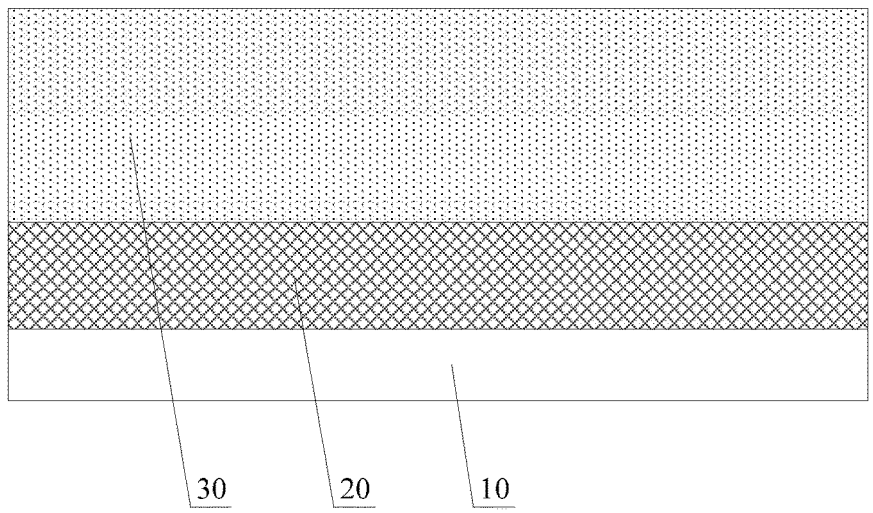
FIG. 1 is a schematic diagram of a structure of a touch display substrate provided according to an embodiment of the present disclosure.

Hereinafter, embodiments of the present disclosure will be described in detail with reference to the accompanying drawings. Embodiments in the present disclosure and features in the embodiments may be combined with each other arbitrarily without conflict.

A plurality of embodiments are described in the present disclosure, but the description is exemplary rather than limiting, and for those of ordinary skills in the art, there may be more embodiments and implementation solutions within the scope of the embodiments described in the present disclosure. Although many possible combinations of features are shown in the drawings and discussed in the detailed description, many other combinations of the disclosed features are also possible. Unless specifically limited, any feature or element of any embodiment may be used in combination with, or may replace, any other feature or element of any other embodiment.

The present disclosure includes and contemplates combinations of features and elements known to those of ordinary skilled in the art. The disclosed embodiments, features and elements of the present disclosure may be combined with any regular features or elements to form a technical solution defined by the claims. Any feature or element of any embodiment may also be combined with features or elements from other technical solutions to form another technical solution defined by the claims. Therefore, it should be understood that any of the illustrated features discussed in the present disclosure may be implemented individually or in any suitable combination. Therefore, embodiments are not limited unless by the appended claims and their equivalents. In addition, various modifications and changes can be made within the protection scope of the appended claims.

Unless otherwise defined, technical terms or scientific terms used in the present disclosure shall have ordinary meanings understood by those of ordinary skills in the field to which the present disclosure belongs. The words "first", "second" and the like used in the present disclosure do not indicate any order, quantity or importance, but are only used to distinguish different components. A word such as "include", "contain", or the like means that an element or item appearing before the word covers an element or item listed after the word and the equivalents, but does not exclude other elements or items. A word such as "connecting", "connected", or the like is not limited to a physical or mechanical connection, but may include connecting electrically, no matter direct or indirect. "Up", "down", "left", "right", etc. are only used to represent a relative position relationship that may change accordingly when an absolute position of an object described changes.

FIG. 1 is a schematic diagram of a structure of a touch display substrate provided according to an embodiment of the present disclosure. As shown in FIG. 1, a touch display substrate provided according to an embodiment of the present disclosure includes a base substrate 10, and a touch structure layer 20 and a display structure layer 30 disposed on the base substrate 10.

The touch structure layer 20 is configured to implement touch control, and the display structure layer 30 is configured to implement display. The touch structure layer 20 is located on a side, close to the base substrate 10, of the display structure layer 30.

In an exemplary embodiment, the base substrate 10 may be a rigid substrate or a flexible substrate, wherein the material of the rigid substrate may be, but is not limited to, one or more of glass and metal foil; the material of the flexible substrate may be, but is not limited to, one or more of polyethylene terephthalate, ethylene terephthalate, polyether ether ketone, polystyrene, polycarbonate, polyarylate, polyimide, polyvinyl chloride, polyethylene, and textile fibers.

In an exemplary embodiment, the base substrate 10 is a flexible substrate, such that the display product may be more suitable for achieving the flexible touch function, and the bending performance of the display product may be improved.

In an exemplary embodiment, the touch structure layer 20 may be a self-capacitance touch structure or a mutual-capacitance touch structure.

In an exemplary embodiment, the display structure layer 30 may include a liquid crystal display structure, or may include an organic light-emitting diode display structure.

In an exemplary embodiment, the display structure layer is an organic light-emitting diode display structure, which can improve the bending performance of the touch display substrate and achieve the folding of the touch display substrate.

The touch display substrate provided according to an embodiment of the disclosure includes a base substrate and a touch structure layer and a display structure layer disposed on the base substrate; wherein the touch structure layer is configured to implement touch control, the display structure layer is configured to implement display, the touch structure layer is located on a side, close to the base substrate, of the display structure layer. According to the technical solution provided according to an embodiment of the disclosure, by arranging the touch structure layer which is configured to implement touch control between the base substrate and the display structure layer, not only the damage to the display product can be avoided when the display product achieves touch control and the yield of the display product can be improved, but also the thickness of the display product can be reduced.

Figure 2:
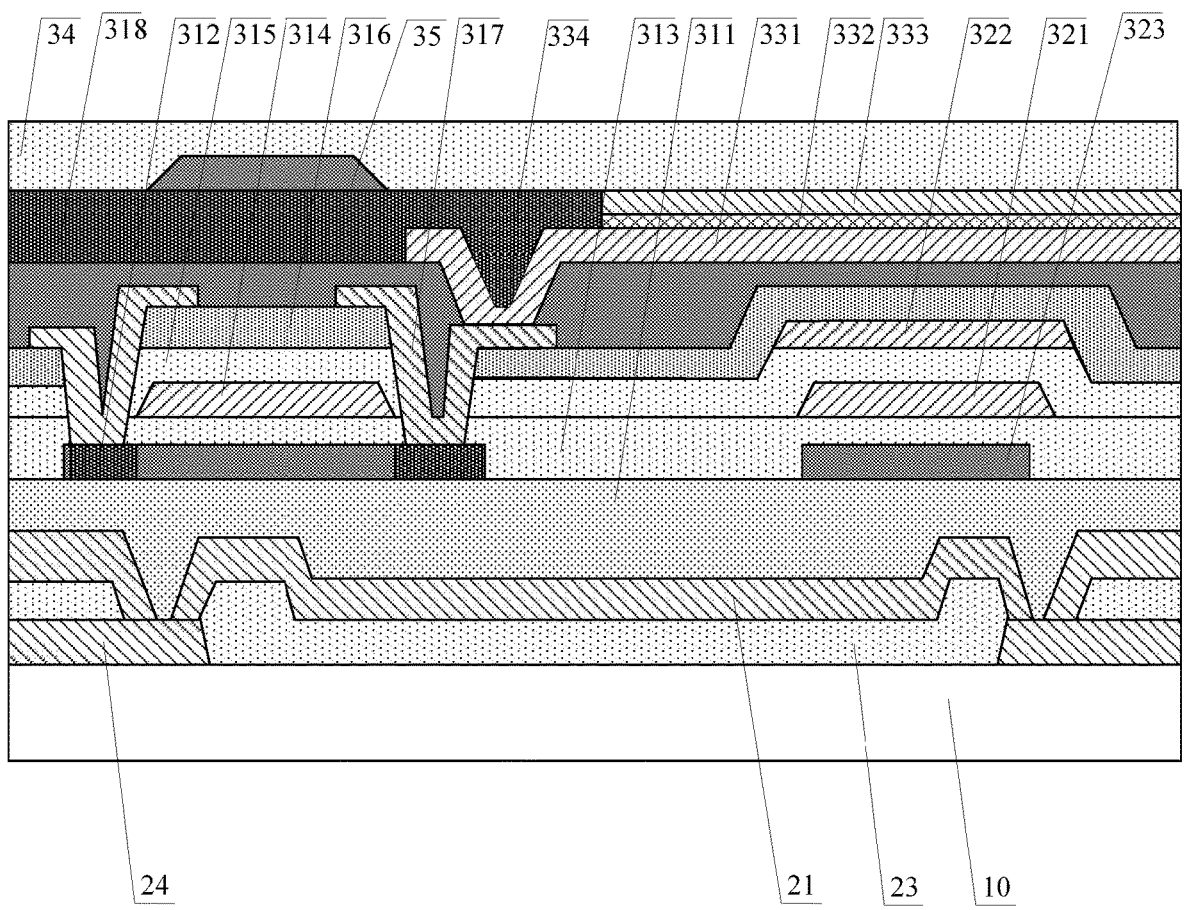
FIG. 2 is a schematic diagram of a structure of a touch display substrate provided according to an exemplary embodiment.
Figure 3:
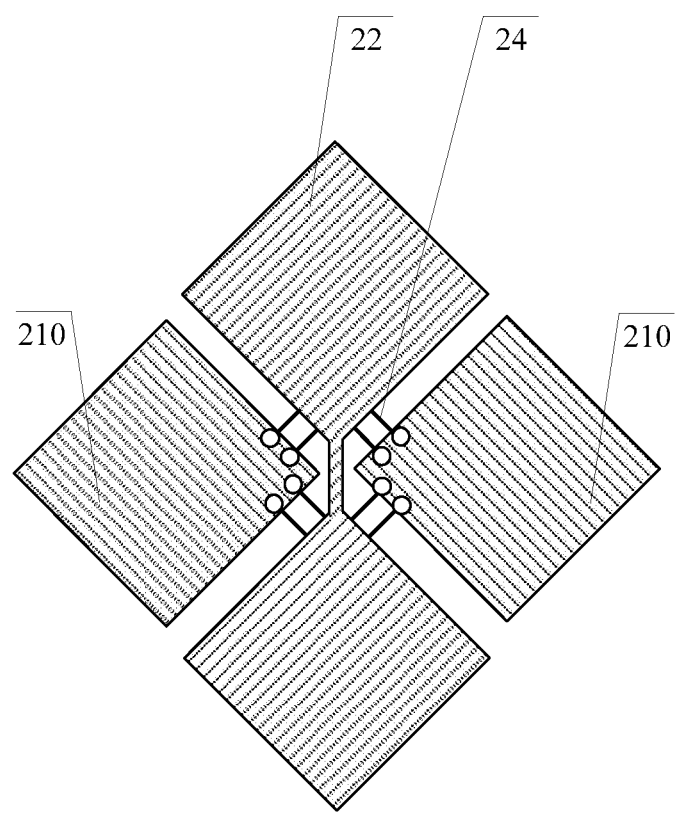
FIG. 3 is a top view of the touch structure layer corresponding to FIG. 2.

FIG. 2 is a structural schematic diagram of a touch display substrate provided according to an exemplary embodiment, and FIG. 3 is a top view of a touch structure layer corresponding to FIG. 2. As shown in FIGS. 2 and 3, a touch structure layer 20 in a touch display substrate provided according to an exemplary embodiment includes a first touch electrode 21, a second touch electrode 22, and an insulating layer 23. The first touch electrode 21 and the second touch electrode 22 are disposed on the same layer.

The insulating layer 23 is located on a side, close to the base substrate, of the first touch electrode 21, and is provided to insulate the first touch electrode 21 from the second touch electrode 22.

In an exemplary embodiment, the first touch electrodes 21 and the second touch electrodes 22 are in a staggered arrangement.

In an exemplary embodiment, the first touch electrode 21 and the second touch electrode 22 can be disposed in the same layer or in different layer. For example, in FIG. 2 and FIG. 3, the first touch electrode 21 is disposed on the same layer as the second touch electrode 22.

In an exemplary embodiment, the first touch electrode 21 may be a driving electrode and the second touch electrode 22 may be a sensing electrode, or the first touch electrode 21 may be a sensing electrode and the second touch electrode 22 may be a driving electrode.

In an exemplary embodiment, both the first touch electrode 21 and the second touch electrode 22 are formed by a metal mesh structure.

In an exemplary embodiment, the patterns of the metal meshes of the first touch electrode 21 and the second touch electrode 22 are the same. The patterns of the metal meshes being the same refers to that metal traces of the metal meshes follow a same direction and have a same line width. A metal mesh is used as the touch electrode, a metal material has better malleability and is not easy to break, thus bending performance of the touch display substrate may be improved to make the touch substrate be more suitable for achieving a flexible touch function, and cost may also be reduced.

In an exemplary embodiment, the line width of the metal mesh may be 2 microns to 5 microns.

In an exemplary embodiment, the manufacturing materials of the first touch electrode 21 and the second touch electrode 22 may include at least one of copper (Cu), silver (Ag), aluminum (Al), titanium (Ti) or nickel (Ni).

In an exemplary embodiment, the manufacturing materials of the first touch electrode 21 and the second touch electrode 22 may be the same or different.

In an exemplary embodiment, the first touch electrode 21 and the second touch electrode 22 are disposed on the same layer, made of the same material, and have the same pattern, the base substrate 10 is fully arranged with metal meshes with the same pattern, which improves the problems of poor shadow dispelling and optical moire pattern which is caused by mutual interference due to differences in line widths of different layers of metal meshes etc., and has a better shadow dispelling effect.

As shown in FIGS. 2 and 3, when the first touch electrode 21 and the second touch electrode 22 are disposed on the same layer, the touch structure layer 20 in the touch display substrate provided according to an exemplary embodiment further includes a connecting layer 24.

The first touch electrode 21 includes a plurality of mutually independent sub-touch electrodes 210. Adjacent sub-touch electrodes 210 are electrically connected by the connecting layer 24. The connecting layer 24 and the first touch electrode 21 are disposed on different layers.

In an exemplary embodiment, the connecting layer 24 is located on a side, close to the base substrate 10, of the first touch electrode 21.

In an exemplary embodiment, the connecting layer 24 includes at least one connecting electrode. The number of connecting electrodes may be defined according to actual needs.

In an exemplary embodiment, connecting layer 24 is formed by a metal mesh structure. The metal mesh is used as the connecting layer, and the metal material has better malleability and is not easy broken, and the bending performance of the touch display substrate may be improved to make the touch substrate be more suitable for achieving the flexible touch function, and cost may be reduced, and the shadow dispelling problem caused by using solid metal may be avoided.

In an exemplary embodiment, the base substrate 10 may be a transparent substrate.

In an exemplary embodiment, the manufacturing material of the base substrate 10 may be polyimide, and forming the base substrate 10 with polyimide can improve the bending performance of the display product, so as to make the display product more suitable for achieving the flexible touch function.

As shown in FIGS. 2 and 3, in an exemplary embodiment, when the display structure layer is an organic light-emitting diode display structure, the display structure layer 30 includes a driving structure layer, a light-emitting structure layer, and an encapsulation layer 34.

The driving structure layer is located on a side, close to the base substrate, of the light-emitting structure layer, and the encapsulation layer is located on a side, away from the base substrate, of the light-emitting structure layer. The orthographic projection of the touch structure layer 20 on the base substrate 10 and the orthographic projection of the light-emitting structure layer 33 on the base substrate have an overlapping area.

As shown in FIG. 2 and FIG. 3, in an exemplary embodiment, the driving structure layer includes a transistor and a storage capacitor. The transistor includes an active layer 312, a gate electrode 314, and source-drain electrodes 317. The storage capacitor includes a first plate 321 and a second plate 322.

In an exemplary embodiment, there are multiple transistors.

In an exemplary embodiment, the transistor can be a top gate structure or a bottom gate structure, and in FIG. 2, the transistor is illustrated as a top gate structure, for example.

The first plate 321 is disposed on the same layer as the gate electrode 314 of the transistor, and the second plate 322 is located on a side, away from the base substrate 10, of the first plate 321, and is disposed in a different layer from the source-drain electrodes 317 of the transistor. The orthographic projection of the second polar plate 322 on the base substrate 10 is at least partially overlapped with that of the first polar plate 321 on the base substrate 10.

As shown in FIGS. 2 and 3, in an exemplary embodiment, the touch display substrate may further include a shielding layer 323, which is disposed on the same layer as the active layer 312. The orthographic projection of the shielding layer 323 on the base substrate 10 is at least partially overlapped with that of the first polar plate 321 on the base substrate.

As shown in FIGS. 2 and 3, in an exemplary embodiment, the touch display substrate may further include a first insulating layer 311, a second insulating layer 313, a third insulating layer 315, a fourth insulating layer 316, and a flat layer 318.

In an exemplary embodiment, the organic light-emitting diode display structure is a flexible organic light-emitting diode display structure, which can improve the bending performance of the touch display substrate.

In an exemplary embodiment, the driving structure layer includes a first insulating layer, a semiconductor layer, a second insulating layer, a first metal layer, a third insulating layer, a second metal layer, a fourth insulating layer, a third metal layer, and a flat layer which are sequentially disposed along a direction perpendicular to the base substrate.

The semiconductor layer includes the active layer of the transistor and the shielding layer, the first metal layer includes the gate electrode of the transistor and the first plate, the second metal layer includes the second plate, and the third metal layer includes source-drain electrodes of the transistor.

In an exemplary embodiment, the first electrode plate 321 and the gate electrode 314 are disposed on the same layer and formed by the same process, which can simplify the manufacturing process of the touch display substrate.

In an exemplary embodiment, the light-emitting structure layer includes a first electrode 331, an organic light-emitting layer 332, a second electrode 333, and a pixel define layer 334. The first electrode 331 is disposed on a side, close to the base substrate 10, of the organic light-emitting layer 332, and the second electrode 333 is disposed on a side, away from the base substrate 10, of the organic light-emitting layer 332. The first electrode 331 is connected to the drain electrode in the transistor 31.

As shown in FIG. 2, in an exemplary embodiment, the touch display substrate further includes an isolation column 35 disposed between the light-emitting structure layer and the encapsulation layer. The orthographic projection of the pixel define layer 334 on the base substrate 10 covers the orthographic projection of the isolation column 35 on the base substrate 10.

Figure 4:
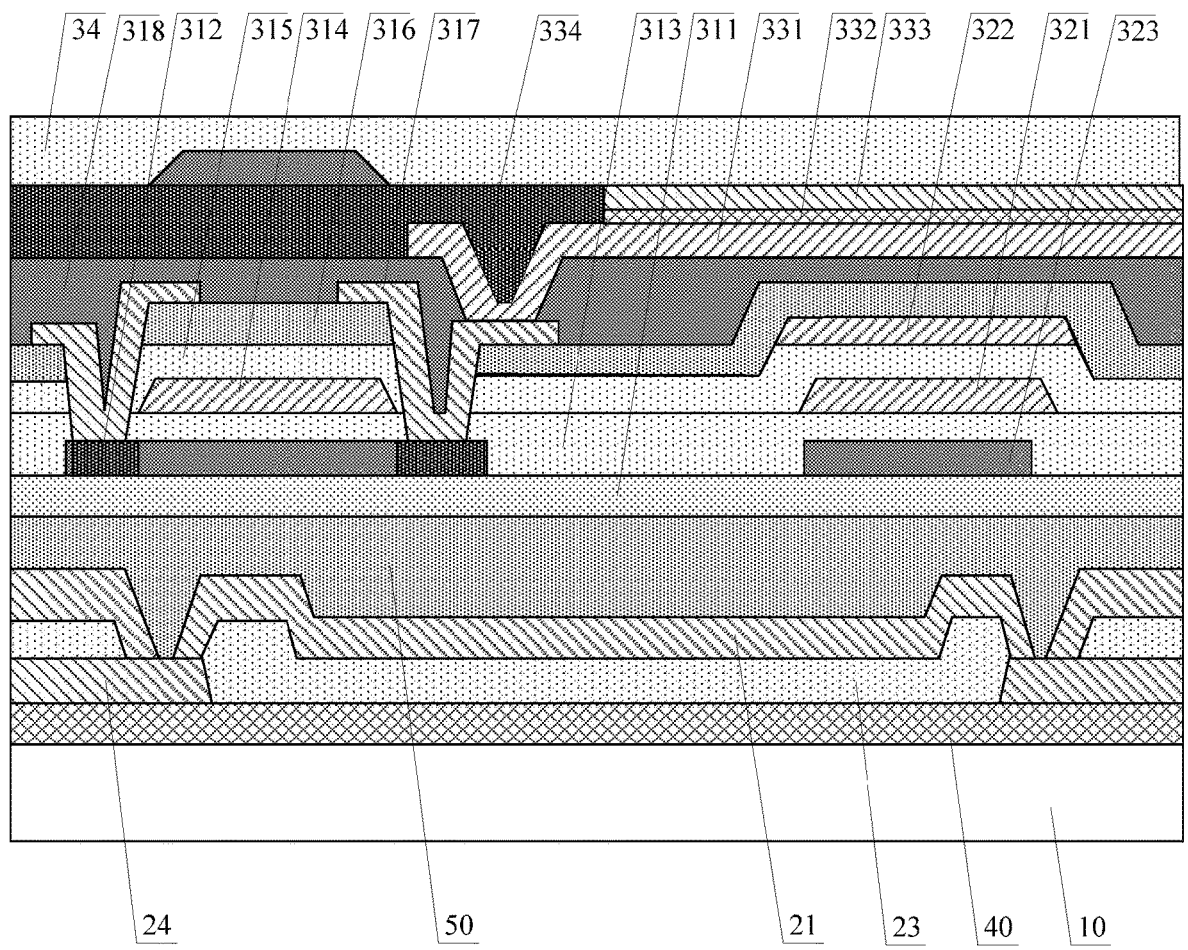
FIG. 4 is a schematic diagram of a structure of a touch display substrate provided according to another exemplary embodiment.

FIG. 4 is a schematic diagram of a structure of a touch display substrate provided according to another exemplary embodiment. As shown in FIG. 4, the touch display substrate provided according to an exemplary embodiment further includes a barrier layer 40. The barrier layer 40 is located on a side, close to the base substrate 10, of the touch structure layer 20.

In an exemplary embodiment, a manufacturing material of the barrier layer 40 may be silicon oxide, silicon nitride, or a composite of silicon oxide or silicon nitride.

Setting the barrier layer 40 on a side, close to the base substrate 10, of the touch structure layer 20, can avoid the damage to the base substrate 10 when manufacturing the touch structure layer 20, and can improve the reliability of the touch display substrate.

As shown in FIG. 4, the touch display substrate provided according to an exemplary embodiment further may include a protection layer 50. The protection layer 50 is located on a side, close to the display structure layer 30, of the touch structure layer 20.

In an exemplary embodiment, a manufacturing material of the protection layer 50 may be silicon oxide, silicon nitride, or a composite of silicon oxide or silicon nitride.

The protection layer 50 is disposed on a side, close to the display structure layer 30, of the touch structure layer 20, so that the display structure layer 30 is disposed on a side, away from the base substrate, of the protection layer 50, which can improve the uniformity of the driving structure layer.

Figure 5:
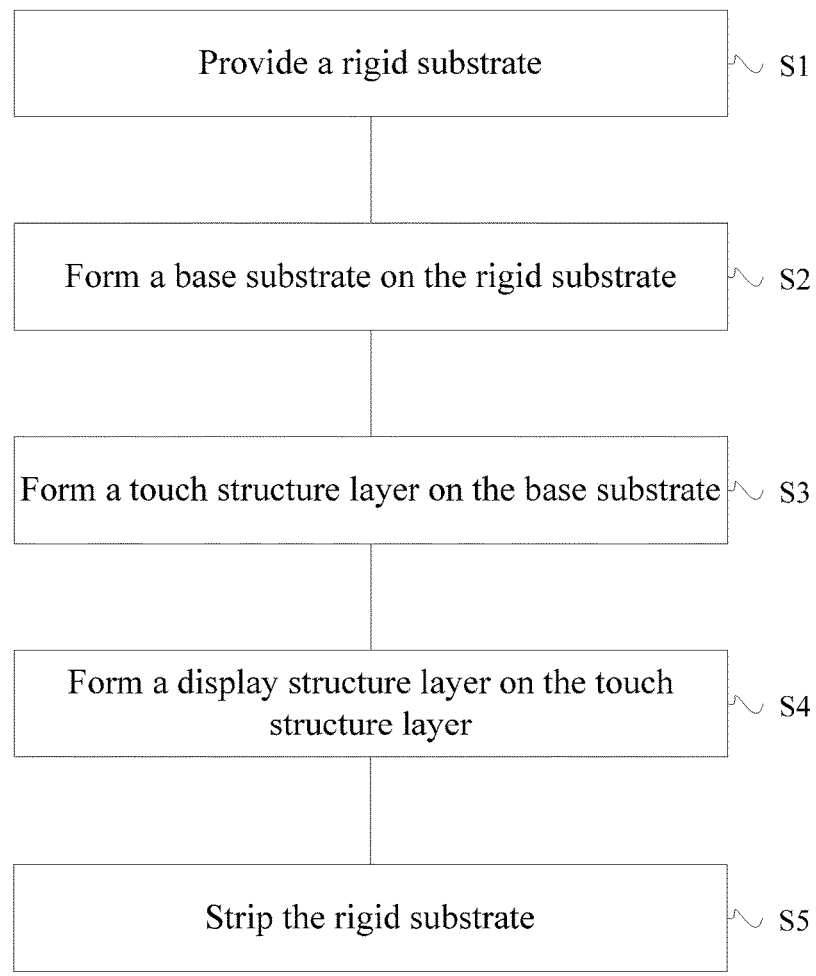
FIG. 5 is a flowchart of a method for manufacturing a touch display substrate provided according to an embodiment of the present disclosure.

FIG. 5 is a flowchart of a method for manufacturing a touch display substrate provided according to an embodiment of the present disclosure. As shown in FIG. 5, a method for manufacturing a touch display substrate provided according to an embodiment of the present disclosure includes the following steps.

In step S1, a rigid substrate is provided.

In an exemplary embodiment, the material of the rigid substrate may be, but is not limited to, one or more of glass and metal foil sheet.

In step S2, a base substrate is formed on the rigid substrate.

In an exemplary embodiment, the base substrate 31 may be a flexible substrate, the material of the flexible substrate may be, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers.

In an exemplary embodiment, the base substrate may be a transparent substrate.

In an exemplary embodiment, the manufacturing material of the base substrate may include polyimide.

In an exemplary embodiment, the step S2 may include coating polyimide solution on a rigid substrate to form the base substrate.

In step S3, a touch structure layer is formed on the base substrate sequentially.

In step S4, a display structure layer is formed on the touch structure layer.

In step S5, the rigid substrate is stripped.

When the rigid substrate is a glass substrate, the step S5 may include stripping the rigid substrate with laser and performing cutting to form the touch display substrate.

The touch display substrate is a touch display substrate provided according to any one of the previous embodiments, and they are similar in the realization principle and effect, which will not be described further here.

The patterning process may include a film forming process, a photolithography process, or a photolithography process and an etching step, and may also include printing, inkjet and other processes for forming a predetermined pattern. Herein, the film forming process refers to a process of forming thin films by coating, sputtering, printing or evaporation. Photolithography process refers to a process of forming a predetermined pattern through the steps of film forming, exposure and development photolithography. The photolithography process can use photoresist, a mask plate or an exposure machine to form a predetermined pattern by using the above photolithography steps. Different film layers can choose corresponding patterning processes.

In an exemplary embodiment, the step S3 may include forming a connecting layer on the base substrate through a patterning process; forming an insulating layer on a side, away from the base substrate, of the connecting layer, through a patterning process; and forming a first touch electrode and a second touch electrode on a side, away from the base substrate, of the insulating layer through a patterning process to form the touch structure layer. The display structure layer is formed on the touch structure layer through a patterning process.

Before the step S3, the method for manufacturing a touch display substrate provided according to an exemplary embodiment further includes forming a barrier layer on the base substrate through a patterning process.

After the step S3, the method for manufacturing a touch display substrate provided according to an exemplary embodiment further includes: forming a protection layer on a side, away from the base substrate, of the touch structure layer, through a patterning process.

In an exemplary embodiment, the step S4 includes forming a driving structure layer on the touch structure layer; forming a light-emitting structure layer on the driving structure layer; and forming an encapsulation layer on the light-emitting structure layer.

In an exemplary embodiment, forming the driving structure layer on the touch structure layer includes: forming a first insulating layer, a semiconductor layer, a second insulating layer, a first metal layer, a third insulating layer, a second metal layer, a fourth insulating layer, a third metal layer, and a flat layer sequentially on the touch structure layer to form the driving structure layer.

In an exemplary embodiment, the semiconductor layer includes an active layer of a transistor and a shielding layer, the first metal layer includes a gate electrode of the transistor and a first plate, the second metal layer includes a second plate, and the third metal layer includes source-drain electrodes of the transistor.

In an exemplary embodiment, forming the light-emitting structure layer on the driving structure layer includes: forming a first electrode, a pixel define layer, an organic light-emitting layer, and a second electrode sequentially on the driving structure layer to form the light-emitting structure layer.

In an exemplary embodiment, forming the encapsulation layer on the light-emitting structure layer includes: forming an isolation column and an encapsulation layer on the light-emitting structure layer sequentially.

A method for manufacturing a touch display substrate provided according to an exemplary embodiment is described with reference to the FIGS. 6A-6G in the following.

Figure 6A:
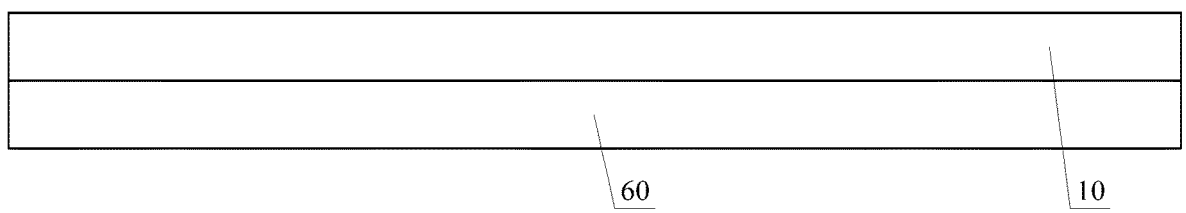
FIG. 6A is a first schematic diagram of a method for manufacturing a touch display substrate provided according to an exemplary embodiment.

At step 100, a rigid substrate 60 is provided, and a base substrate 10 is formed on the rigid substrate 60, as shown in FIG. 6A.

In an exemplary embodiment, the rigid substrate 60 is a glass substrate, and the manufacturing material of the base substrate is transparent polyimide.

Figure 6B:
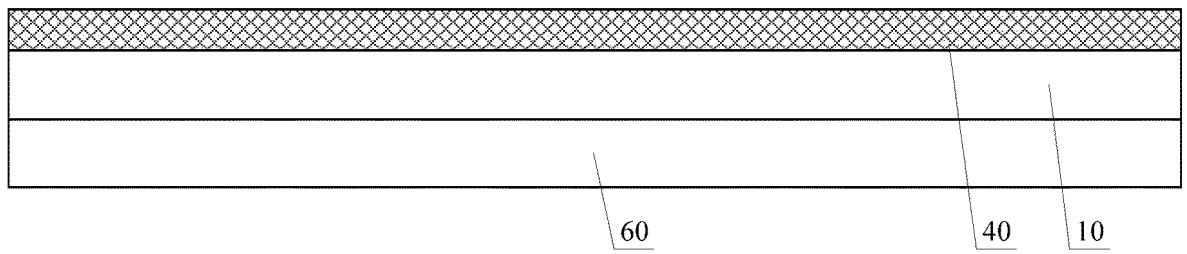
FIG. 6B is a second schematic diagram of a method for manufacturing a touch display substrate provided according to an exemplary embodiment.

At step 200, a barrier layer 40 is formed on the base substrate 10 through a patterning process, as shown in FIG. 6B.

Figure 6C:
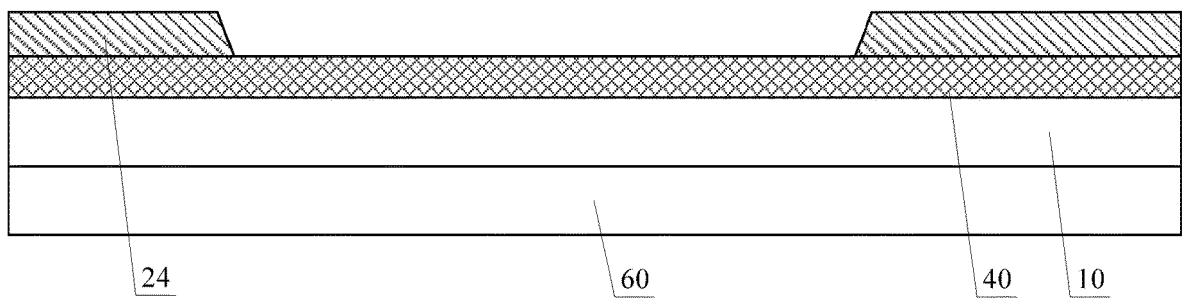
FIG. 6C is a third schematic diagram of a method for manufacturing a touch display substrate provided according to an exemplary embodiment.

At step 300, a connecting layer 24 is formed on the barrier layer 40 through a patterning process, as shown in FIG. 6C.

Figure 6D:
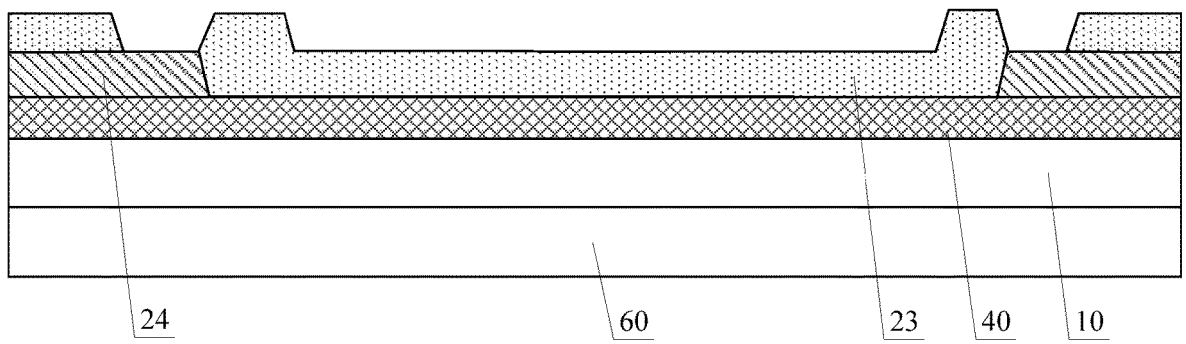
FIG. 6D is a fourth schematic diagram of a method for manufacturing a touch display substrate provided according to an exemplary embodiment.

In step 400, an insulating layer 23 is formed on the connecting layer 24 through a patterning process, as shown in FIG. 6D.

Figure 6E:
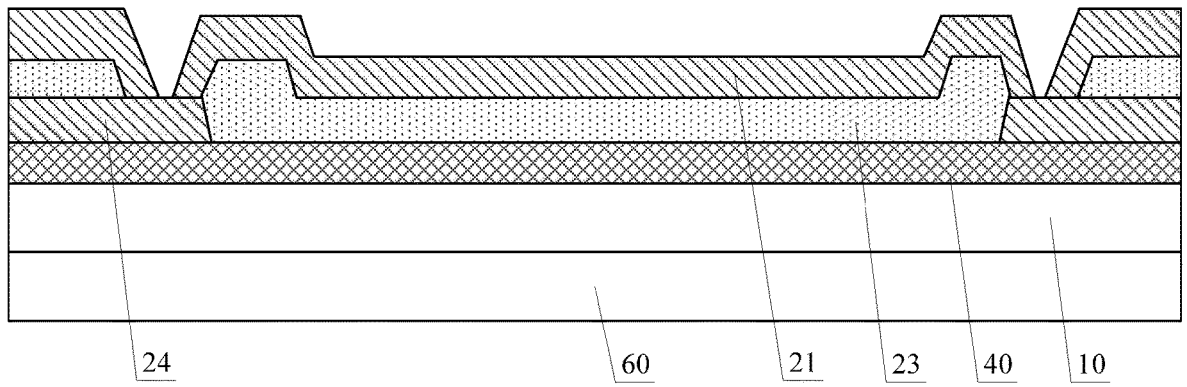
FIG. 6E is a fifth schematic diagram of a method for manufacturing a touch display substrate provided according to an exemplary embodiment.

At step 500, a first touch electrode 21 and a second touch electrode (not shown in the figure) are formed on the insulating layer 23 through a patterning process, as shown in FIG. 6E.

Figure 6F:
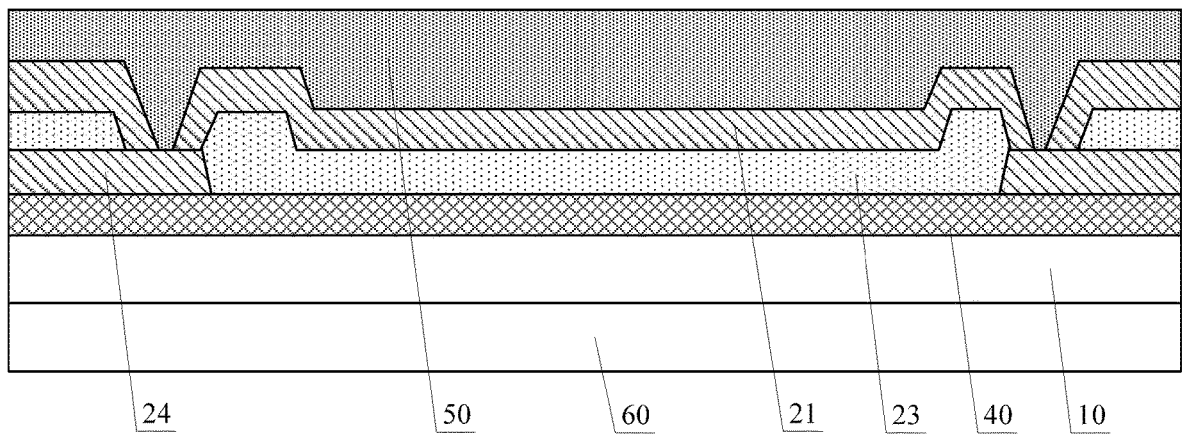
FIG. 6F is a sixth schematic diagram of a method for manufacturing a touch display substrate provided according to an exemplary embodiment.

In step 600, a protection layer 50 is formed on the first touch electrode 21 and the second touch electrode through a patterning process, as shown in FIG. 6F.

Figure 6G:
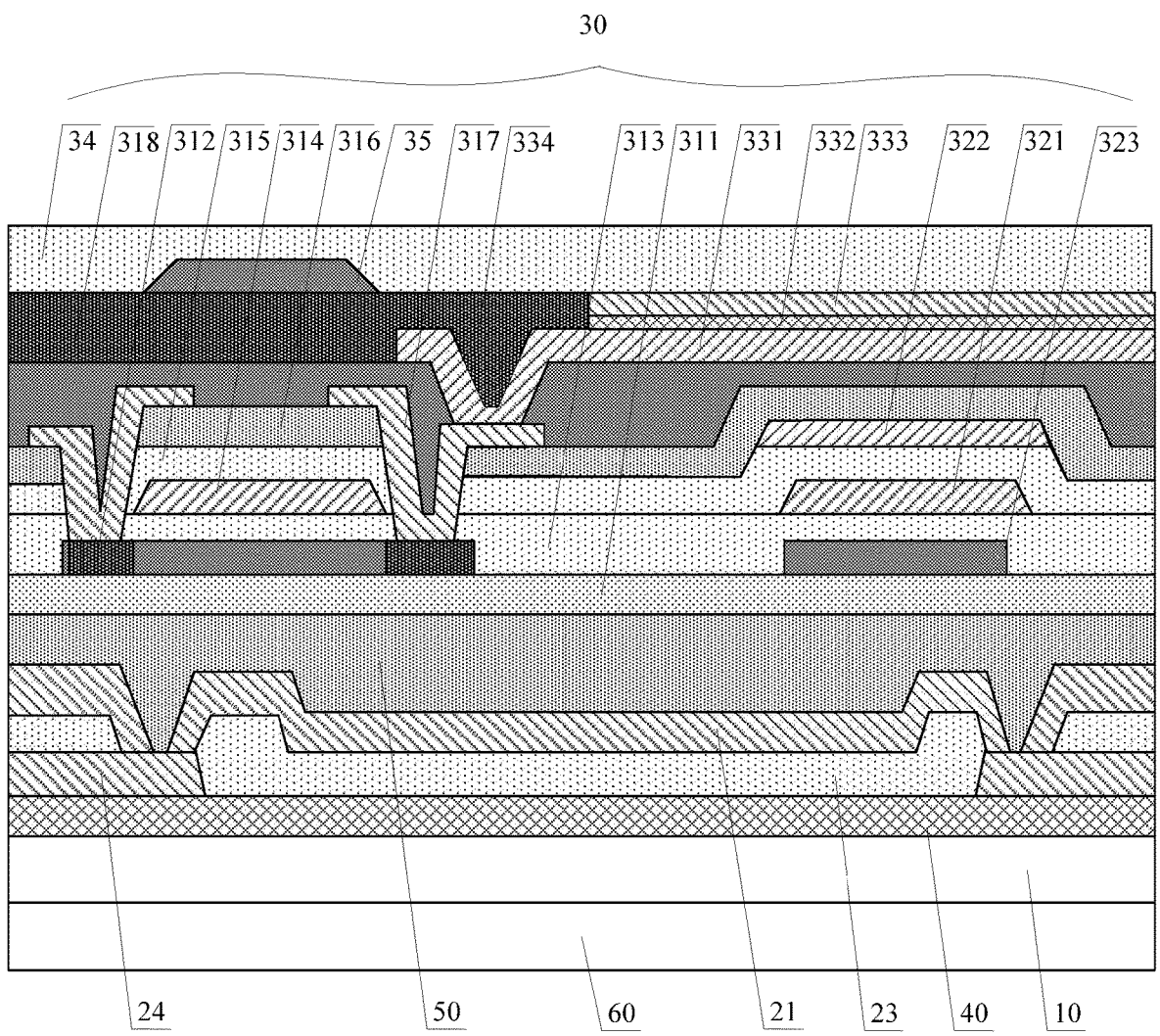
FIG. 6G is a seventh schematic diagram of a method for manufacturing a touch display substrate provided according to an exemplary embodiment.

At Step 700, a display structure layer 30 is formed on the protection layer 50 through patterning process, including: forming a first insulating layer 311 on the protection layer 50, forming an active layer 312 and a shielding layer 323 on the first insulating layer 311 through the same patterning process, forming a second insulating layer 313 on the first insulating layer 311 on which the shielding layer 323 and the active layer 312 of the transistor are formed. forming a gate electrode 314 and first plate 321 on second insulating layer 313, forming a third insulating layer 315 on the second insulating layer 313 on which the gate electrode 314 and first plate 321 are formed, forming a second polar plate 322 on the third insulating layer 315, forming a fourth insulating layer 316 on the third insulating layer 315 on which the second polar plate 322 is formed, forming source-drain electrodes 317 on the fourth insulating layer 316, forming a flat layer 318 on the fourth insulating layer 316 on which the source-drain electrodes 317 is formed, forming a light-emitting structure layer, including a first electrode 331, an organic light-emitting layer 332, a second electrode 333 and a pixel define layer 334, on the flat layer 318, forming an isolation column 35 on the light-emitting structure layer, and forming an encapsulation layer 34 on the isolation column 35, as shown in FIG. 6G.

At step 800, the rigid substrate 60 is stripped and cut to form the touch display substrate, as shown in FIG. 4.

An embodiment of the present disclosure also provides a touch display apparatus, including a touch display substrate.

The touch display substrate is a touch display substrate provided according to any one of the previous embodiments, and they are similar in the realization principle and effect, which will not be described further here.

In an exemplary embodiment, the touch display apparatus may be a Liquid Crystal Display (LCD) or an Organic Light-Emitting Diode (OLED). When the touch display apparatus is a liquid crystal display apparatus, the liquid crystal display apparatus includes a liquid crystal display panel and a backlight module, the liquid crystal display panel includes an array substrate, a pair substrate, and a liquid crystal layer disposed between the array substrate and the pair substrate, and the backlight module includes a backlight source, a diffusion plate and a light guide plate. When the touch display apparatus is an organic electroluminescent diode display apparatus, the touch display apparatus includes an organic electroluminescent diode display panel, the organic electroluminescent diode display panel includes a cathode, an anode and a light-emitting layer.

In an exemplary embodiment, the touch display apparatus can be a mobile phone, a tablet computer, a television, a display, a notebook computer, a digital photo frame, or a navigator, or can be any product or component with display and touch functions.

In an exemplary embodiment, the touch display apparatus may be any apparatus that displays an image no matter the image is mobile (e.g., video) or stationary (e.g., still image) and no matter the image is of text or picture. The touch display apparatus can be implemented in, or associated with, various electronic apparatuses.

In an exemplary embodiment, various electronic apparatuses are, such as, but not limited to, mobile phones, wireless apparatuses, personal data assistants, hand-held or portable computers, GPS receivers/navigators, cameras, MP4 video players, video cameras, game consoles, watches, clocks, calculators, television monitors, flat panel displays, computer monitors, automobile displays (e.g., odometer displays), or navigators.

The drawings in the present disclosure only involve the structures included in the embodiments of the present disclosure, and other structures may refer to common designs.

For sake of clarity, the thickness and size of a layer or a microstructure are exaggerated in the drawings used for describing the embodiments of the present disclosure. It should be understood that when an element such as a layer, film, region or substrate is illustrated as being "on" or "under" another element, the element may be "directly" "on" or "under" the other element, or there may be an intervening element.

Although implementations disclosed in the present disclosure are described in the above, the described contents are only implementations used for facilitating the understanding of the present disclosure, but are not used to limit the present disclosure. Any person skilled in the art to which the present disclosure pertains may make any modifications and variations in the form and details of implementations without departing from the spirit and the scope of the present disclosure, but the patent protection scope of the present disclosure shall still be subject to the scope defined in the appended claims.

What we claim is:

1. A touch display substrate comprising:
    a base substrate, and a touch structure layer and a display structure layer disposed on the base substrate;
    wherein the touch structure layer is configured to implement touch control, and the display structure layer is configured to implement display, the whole display structure layer is located on a side, away from the base substrate, of the touch structure layer, and the whole touch structure layer is located on a side, close to the base substrate, of the display structure layer,
    wherein the display structure layer, the touch structure layer and the base substrate are stacked sequentially, the whole touch structure layer is located between the display structure layer and the base substrate, and the touch structure layer is in direct contact with the base substrate and in direct contract with the display structure layer respectively,
    wherein the touch structure layer comprises a first touch electrode, a second touch electrode, and an insulating layer;
    wherein the first touch electrode and the second touch electrode are disposed in a same layer;
    wherein the insulating layer is located on a side, close to the base substrate, of the first touch electrode, and is provided to insulate the first touch electrode from the second touch electrode;
    wherein both the first touch electrode and the second touch electrode are formed by a metal mesh structure; and
    wherein a line width of the metal mesh structure is 2 microns to 5 microns.

2. The touch display substrate according to claim 1, wherein the touch structure layer further comprises a connecting layer;
    the first touch electrode comprises a plurality of mutually independent sub-touch electrodes; and
    adjacent sub-touch electrodes are electrically connected by the connecting layer.

3. The touch display substrate according to claim 2, wherein the connecting layer is located on a side, close to the base substrate, of the first touch electrode.

4. The touch display substrate according to claim 3, wherein the connecting layer is formed by a metal mesh structure.

5. The touch display substrate according to claim 1, wherein the base substrate is a transparent substrate;
a manufacturing material of the base substrate comprises polyimide.

6. The touch display substrate according to claim 1, wherein the display structure layer comprises a driving structure layer, a light-emitting structure layer, and an encapsulation layer;
the driving structure layer is located on a side, close to the base substrate, of the light-emitting structure layer, and the encapsulation layer is located on a side, away from the base substrate, of the light-emitting structure layer;
an orthographic projection of the touch structure layer on the base substrate and an orthographic projection of the light-emitting structure layer on the base substrate have an overlapping area.

7. The touch display substrate according to claim 6, wherein the driving structure layer comprises a transistor, a storage capacitor, and a shielding layer, and the storage capacitor comprises a first polar plate and a second polar plate;
the shielding layer and an active layer of the transistor are disposed in a same layer, the first polar plate and a gate electrode of the transistor are disposed in a same layer, and the second polar plate is located on a side, away from the base substrate, of the first polar plate, the second polar plate and source-drain electrodes of the transistor are disposed in different layers;
an orthographic projection of the shielding layer on the base substrate is at least partially overlapped with an orthographic projection of the first polar plate on the base substrate, and an orthographic projection of the second polar plate on the base substrate is at least partially overlapped with an orthographic projection of the first polar plate on the base substrate.

8. The touch display substrate according to claim 7, wherein the driving structure layer comprises a first insulating layer, a semiconductor layer, a second insulating layer, a first metal layer, a third insulating layer, a second metal layer, a fourth insulating layer, a third metal layer, and a flat layer which are sequentially disposed along a direction perpendicular to the base substrate;
the semiconductor layer comprises the active layer of the transistor and the shielding layer, the first metal layer comprises the gate electrode of the transistor and the first plate, the second metal layer comprises the second plate, and the third metal layer comprises the source-drain electrodes of the transistor.

9. The touch display substrate according to claim 8, wherein the light-emitting structure layer comprises a first electrode, an organic light-emitting layer, a second electrode, and a pixel define layer;
the first electrode is disposed on a side, close to the base substrate, of the organic light-emitting layer, and the second electrode is disposed on a side, away from the base substrate, of the organic light-emitting layer;
the first electrode is connected with the drain electrode of the transistor.

10. The touch display substrate according to claim 9, wherein the touch display substrate further comprises an isolation column disposed between the light-emitting structure layer and the encapsulation layer;
an orthographic projection of the pixel define layer on the base substrate covers an orthographic projection of the isolation column on the base substrate.

11. The touch display substrate according to claim 10, wherein the touch display substrate further comprises a barrier layer;
the barrier layer is located on a side, close to the base substrate, of the touch structure layer.

12. The touch display substrate according to claim 11, wherein the touch display substrate further comprises a protection layer;
the protection layer is located on a side, close to the display structure layer, of the touch structure layer.

13. A touch display apparatus comprising the touch display substrate according to claim 1.

14. A method for manufacturing a touch display substrate according to claim 1, comprising:
providing a rigid substrate;
forming a base substrate on the rigid substrate;
forming a touch structure layer on the base substrate;
forming a display structure layer on the touch structure layer, wherein the whole display structure layer is located on a side, away from the base substrate, of the touch structure layer; and
stripping the rigid substrate,
wherein the display structure layer, the touch structure layer and the base substrate are stacked sequentially, the whole touch structure layer is located between the display structure layer and the base substrate, and the touch structure layer is in direct contact with the base substrate and in direct contract with the display structure layer respectively.

15. The method according to claim 14, wherein forming the touch structure layer on the base substrate comprises:
forming a connecting layer on the base substrate through a patterning process;
forming an insulating layer on a side, away from the base substrate, of the connecting layer, through a patterning process; and
forming a first touch electrode and a second touch electrode on a side, away from the base substrate, of the insulating layer, through a patterning process.

16. The method according to claim 15, wherein before forming the touch structure layer on the base substrate, the method further comprises:
forming a barrier layer on the base substrate through a patterning process;
after forming the touch structure layer on the base substrate, the method further comprises:
forming a protection layer on a side, away from the base substrate, of the touch structure layer, through a patterning process.

17. The method according to claim 14, wherein forming the display structure layer on the touch structure layer comprises:
forming a driving structure layer on the touch structure layer;
forming a light-emitting structure layer on the driving structure layer; and
forming an encapsulation layer on the light-emitting structure layer.

18. The method according to claim 17, wherein forming the driving structure layer on the touch structure layer comprises:
forming a first insulating layer, a semiconductor layer, a second insulating layer, a first metal layer, a third insulating layer, a second metal layer, a fourth insulating layer, a third metal layer, and a flat layer sequentially on the touch structure layer to form the driving structure layer;

forming the light-emitting structure layer on the driving structure layer; and forming a first electrode, a pixel define layer, an organic light-emitting layer, and a second electrode sequentially on the driving structure layer to form the light-emitting structure layer;

forming the encapsulation layer on the light-emitting structure layer comprises:

forming an isolation column and the encapsulation layer sequentially on the light-emitting structure layer.

\* \* \* \* \*